(12) United States Patent
Chen

(10) Patent No.: US 8,991,040 B2
(45) Date of Patent: Mar. 31, 2015

(54) REUSABLE ELECTRONIC CIRCUIT ASSEMBLING AND TESTING SYSTEM AND USES THEREOF

(75) Inventor: Erli Chen, Belle Meade, NJ (US)

(73) Assignee: 5eTek, LLC, Princeton, NJ (US)

( * ) Notice: Subject to any disclaimer, the term of this patent is extended or adjusted under 35 U.S.C. 154(b) by 25 days.

(21) Appl. No.: 13/506,974

(22) Filed: May 29, 2012

(65) Prior Publication Data

US 2012/0317801 A1    Dec. 20, 2012

Related U.S. Application Data

(60) Provisional application No. 61/498,501, filed on Jun. 17, 2011.

(51) Int. Cl.
*H05K 3/20*    (2006.01)
*G01R 31/00*   (2006.01)
*H05K 7/10*    (2006.01)
*G01R 1/04*    (2006.01)

(52) U.S. Cl.
CPC .............. *G01R 31/00* (2013.01); *H05K 7/1038* (2013.01); *G01R 1/0408* (2013.01)
USPC .............. 29/831; 29/829; 29/825; 29/592.1; 29/744; 29/729; 29/700; 29/751; 29/752; 439/43; 439/49; 439/39; 439/625; 439/624; 439/660; 439/692; 439/697; 439/40; 439/700; 434/118; 434/224; 434/301; 434/379; 361/807; 361/729; 361/731; 361/808; 361/811; 335/205; 335/207

(58) Field of Classification Search
USPC ........ 29/744, 729, 700, 751, 752; 439/43, 49, 439/39, 625, 624, 660, 692, 697; 434/118, 434/224, 301, 379; 361/807, 729, 731, 808, 361/811; 335/205, 207
See application file for complete search history.

(56) References Cited

U.S. PATENT DOCUMENTS 2,983,892 A * 5/1961 Williams et al. ................. 439/49
3,277,589 A * 10/1966 Berdan et al. .................. 434/224
3,845,573 A * 11/1974 Kasamatsu .................... 434/224

(Continued)

FOREIGN PATENT DOCUMENTS

CH        585 942       3/1977
GB        1 049 505     11/1966
WO        WO 86/01342   2/1986

OTHER PUBLICATIONS

European Search Report issued for European Application No. 12864711.2, mailed Jan. 22, 2015.

*Primary Examiner* — Peter DungBa Vo
*Assistant Examiner* — Azm Parvez
(74) *Attorney, Agent, or Firm* — Pearl Cohen Zedek Latzer Baratz LLP

(57) ABSTRACT

A reusable electronic circuit assembling system facilitates assembly and testing of electronic circuits. The system has at least one baseboard and one or more assembling blocks magnetically or mechanically attached to the baseboard. Each assembling block has at least two electrically connected conductive clips located separately in the opening holes of the assembly block. Discrete electronic components are connected by selectively inserting the electrodes of the to-be-connected electronic components into the clips of the assembling blocks. A complete circuit is constructed by attaching the above block-component assemblies on the baseboard and connecting them in accordance with the desired circuit diagram.

17 Claims, 14 Drawing Sheets

(56) References Cited

U.S. PATENT DOCUMENTS

| | | | |
|---|---|---|---|
| 4,332,434 A * | 6/1982 | Neidecker et al. | 439/723 |
| 4,457,721 A * | 7/1984 | Charvolin | 434/224 |
| 4,743,202 A * | 5/1988 | Bach | 439/53 |
| 4,969,827 A | 11/1990 | Hahs, Jr. | 439/68 |
| 5,742,486 A * | 4/1998 | Yangkuai | 361/807 |
| 6,916,211 B2 | 7/2005 | Price | 439/697 |
| 7,273,377 B2 | 9/2007 | Seymour | 439/49 |
| 7,611,357 B2 | 11/2009 | Han et al. | 439/39 |
| 2004/0229489 A1 * | 11/2004 | Lu | 439/214 |
| 2007/0111573 A1 | 5/2007 | Seymour | |

* cited by examiner

REUSABLE ELECTRONIC CIRCUIT ASSEMBLING AND TESTING SYSTEM AND USES THEREOF This invention claims the benefit of Provisional Application No. 61/498,501 filed Jun. 17, 2011 for Reusable Electronic Circuit Assembling and Testing System and Uses Thereof, the subject matter of which is hereby incorporated by reference.

BACKGROUND OF THE INVENTION

1. Field of the Invention

The present invention relates to electronic circuit assembling and testing systems; and, more particularly, to a system for assembling and testing electronic circuits for applications that involve design verification, concept demonstration, product prototyping or teaching and training, wherein the electronic components and the components of the assembling system themselves are reusable.

2. Description of the Prior Art

In industries, institutions and schools, there exists a need for quickly assembling and testing electronic circuits using commercially available discrete electronic components. Such assembly and testing is oftentimes carried out for circuit design and design verification, concept demonstration, product prototyping, or teaching and training. In these circumstances, it is highly desirable that not only the individual electronic components but also the system used for the assembling and testing are reusable. It is also highly desirable that the assembling and testing system is suitable for even unskilled hands, such as students in colleges or high schools. However, at the present time, all current assembling and testing methods of choices, such as printed circuit board, perfboard (stripboard), breadboard (plugboard) and the like, possess this or other disadvantages. For example, when using the printed circuit board or perfboard to assemble a circuit, each electronic component must be soldered onto the board. As such, the electronic components and boards are hardly reusable. Furthermore, the need for soldering equipment and special lab setup limits the usefulness of printed circuit boards or perfboards, particularly in educational settings. Although breadboards are solderless, every type of breadboard has a particular contact layout that must be followed strictly in order to make the right connections; this contact layout requirement significantly restricts the flexibility and usefulness of breadboards, particularly to unskilled users. Even skillful professionals frequently find themselves struggling with the contact layout requirements imposed by breadboards when assembling, making simple modifications, or debugging slightly complicated circuits.

There remains a need in the art for an electronic circuit assembling and testing system that (i) is solderless; (ii) is easy to use and facilitates modifications even by unskilled users. Also needed is an electronic circuit assembling and testing system wherein virtually any used components, including the components of the assembling system, are reusable. In addition, it would be highly desirable if the final layout of an assembled circuit resembles the desired circuit diagram such that it could be easily traced by a user during the assembling, modification and debugging procedures.

SUMMARY OF THE INVENTION

The present invention provides a reusable, solderless electronic circuit assembling and testing system that is easy to use and facilitates modifications even by unskilled users; and wherein virtually any used components, including the components of the assembling system themselves, are reusable. Advantageously, in use of the system, the final layout of an assembled circuit resembles the desired circuit diagram. As such it can be easily traced by a user during the assembly, modification and debugging procedures.

Generally stated, the electronic circuit assembling and testing system comprises at least one baseboard and one or more assembling blocks temporarily attachable to the baseboard. Each assembling block comprises at least two connected conductive clips. To assemble an electronic circuit, appropriate assembling blocks are first attached to the baseboard as connection wires according to the desired circuit. The electrodes/leads of the to-be-connected electronic components are then inserted into the appropriate conductive clips of the appropriate assembling blocks on the baseboard in such a way that it eventually completes the desired circuit when all components are assembled.

In one aspect of the invention, said assembling block has at least two opening hollow holes in its body. Within each hole there is a conductive clip that can hold the electrode of an electronic component tightly, therefore making good electrical contact between them. Adjacent clips in an assembly block are connected through a conductor inside the assembly block.

To connect two electronic components, an assembling block is first attached to a baseboard. An electrode of the first electronic component is then inserted into one of the clips of the assembling block, following the insertion of an electrode of the second electronic component into a different clip of the same assembling block.

An entire electronic circuit can be assembled by repeating the above process, i.e. attaching assembling blocks to the appropriate locations on a baseboard according to the desired circuit diagram and inserting the electrodes of appropriate electronic components into the appropriate assembling blocks.

In another aspect of the invention, said assembling blocks are temporarily attached to said baseboard by magnetic force that results from the interactions between magnetic-magnetic or magnetic-ferromagnetic materials respectively on the baseboard and the assembling blocks.

In one example, the baseboard is made of either magnetic or ferromagnetic material such that a ferromagnetic or magnetic object can be attached onto its surface firmly by magnetic force. If necessary, a layer of electrically insulating material can be added on top of the baseboard to insure no electric shortage will occur during assembling and testing.

Alternatively, the baseboard can be made of non-magnetic and non-ferromagnetic materials, such as plastics. A magnetic or ferromagnetic sheet or layer is then attached on the surface of the baseboard. An insulating layer can be added if necessary.

Accordingly, the assembling block can be made of non-magnetic, non-ferromagnetic materials, such as plastics. A magnetic block or sheet, if the baseboard is made of ferromagnetic material or has a ferromagnetic layer attached on its top, or a ferromagnetic block or sheet, if the baseboard is made of magnetic material or has a magnetic layer attached on its top, is attached onto the bottom of the assembling block, such that the assembly block can be attached to the baseboard firmly by magnetic force.

Alternatively, the assembling block can be made of either magnetic or ferromagnetic material, depending on the magnetic or ferromagnetic property of the baseboard, such that the assembly block can be directly attached to the baseboard by magnetic force. If the magnetic or ferromagnetic material is conductive, an insulating layer can be added onto the surface of the magnetic or ferromagnetic material.

In yet another aspect of the invention, said assembling blocks are attached to said baseboard by mechanical interlocking mechanisms.

In one example, the baseboard comprises equally distanced, protuberant studs on its surface. The size and distance of the studs are designed in such a way that an assembling block can be firmly snapped among the studs, to be thereby attached to the baseboard.

In another example, the baseboard comprises equally distanced hollow holes on its surface and the assembling blocks comprise protuberant studs on their bottom. The shape, size, and distance of the holes and studs are designed in such a way that they can be firmly snapped into each other, to thereby attach the assembling block and the baseboard together.

In general, the baseboard and assembling blocks can comprise any matching structures on their surfaces, either protuberant or hollow. The shape and size of the structures on the baseboard and the assembling blocks are respectively designed in such a way that they can be snapped into each other, thereby firmly holding the assembling blocks and the baseboard together.

BRIEF DESCRIPTION OF THE DRAWINGS

The invention will be more fully understood and further advantages will become apparent when reference is had to the following detailed description and the accompanying drawings, in which:

FIG. 5 illustrates an example of mechanical interlocking structures on the baseboard, showing equally distanced studs, whereon assembling blocks with structures such as those shown in FIG. 7 can be mechanically interlocked with;

DESCRIPTION OF THE PREFERRED EMBODIMENTS

The present invention provides a system and a method of using said system for assembling and testing electronic circuits. The components of the assembling system and the individual electronic components used for building the circuit are intact throughout the entire assembling and testing processes, and are therefore reusable.

Figure 1A:
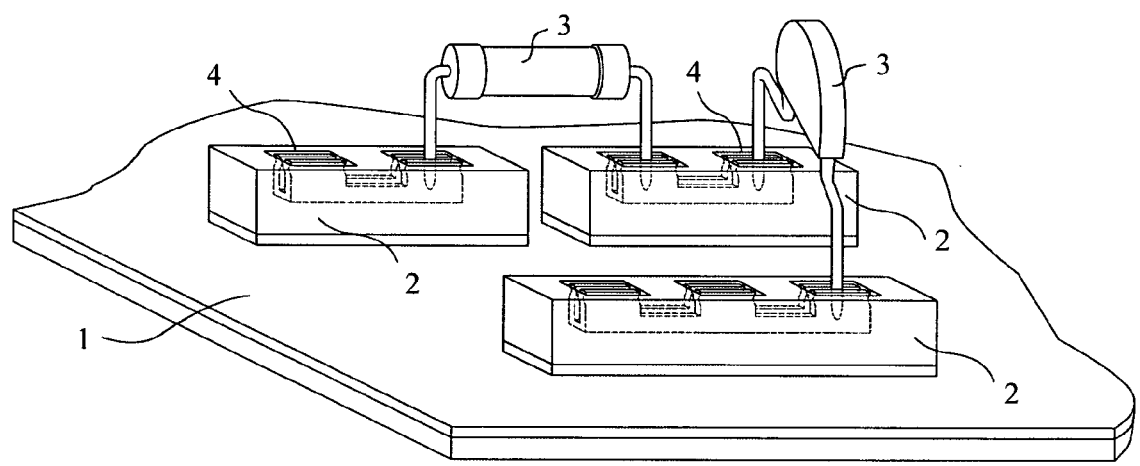
FIG. 1a illustrates an example of the invented electronic circuit assembling and testing systems wherein the assembling blocks 2 are attached to the baseboard 1 by magnetic force.
Figure 1B:
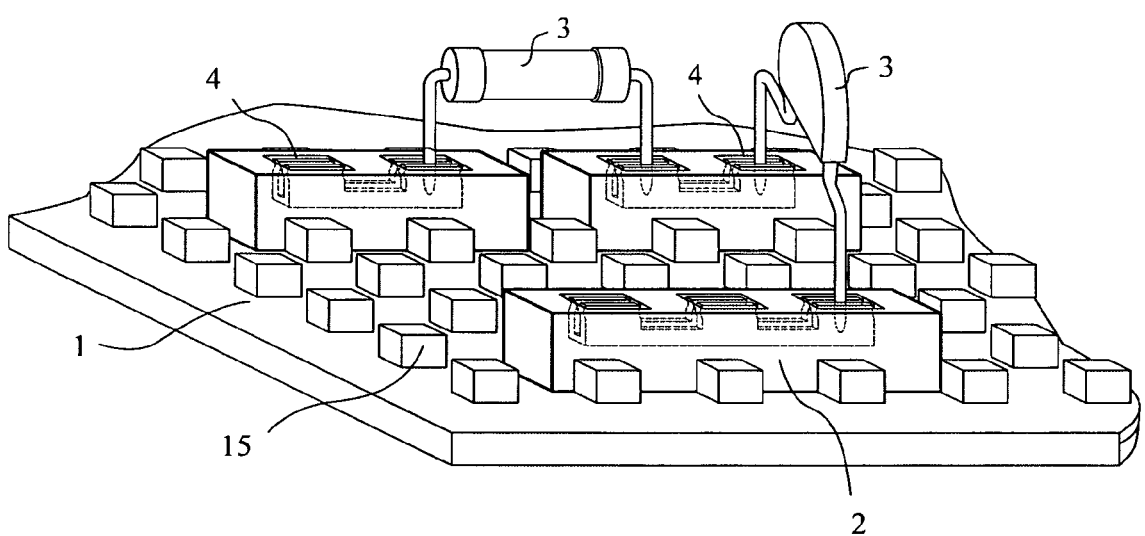
FIG. 1b illustrates an example of the invented electronic circuit assembling and testing systems wherein the assembling blocks 2 are attached to the baseboard 1 by a mechanical interlocking mechanism.

Referring to FIG. 1 of the drawings, the assembling system provided by this invention comprises at least one baseboard 1 and one or several assembling blocks 2. The assembling block 2 is attached to the baseboard either by magnetic force, shown in FIG. 1a as an example, or by a mechanical interlocking mechanism, shown in FIG. 1b. Attachment of the assembling block 2 to the baseboard can be accomplished by other means; and the means shown by FIGS. 1a and 1b should be interpreted as illustrative without limiting the scope of the invention.

Figure 2:
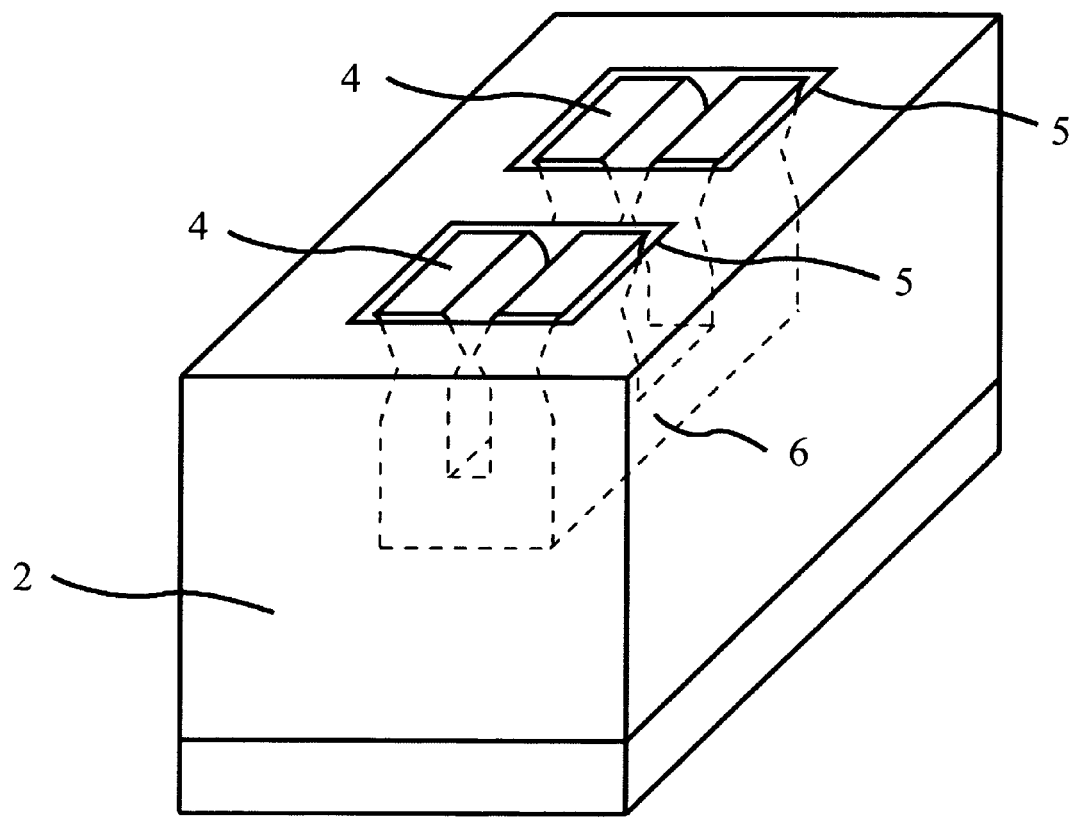
FIG. 2 shows an example of an assembling block that has two electrically connected assembling clips.

Referring to FIG. 2, an assembling block 2 has at least two conductive clips 4 located separately inside holes 5 on the assembling block. Adjacent clips are connected by conductor 6.

Figure 3:
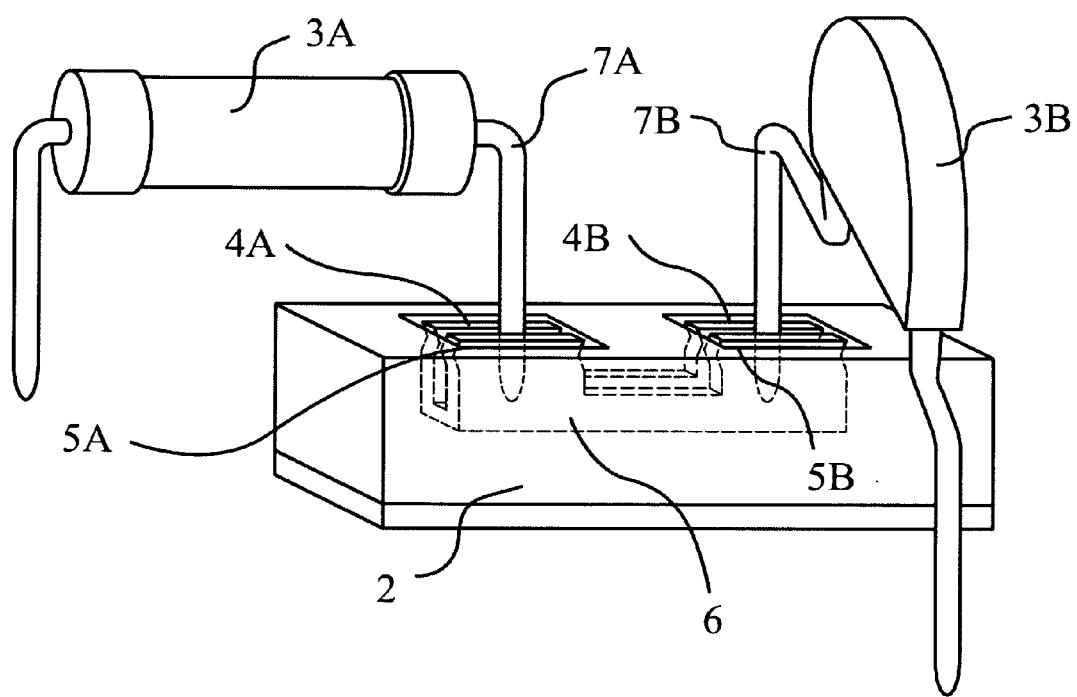
FIG. 3 illustrates the method of connecting two discrete electronic components using an assembling block.

To connect two electronic components 3A and 3B, as illustrated in FIG. 3, the electrode (lead) 7A of the first component 3A is inserted into clip 4A, located inside hole 5A, of an assembling block 2. The electrode 7B of the second component 3B is then inserted into a different clip 4B, inside hole 5B, of the same assembling block. Electrode 7A and 7B are therefore interconnected since the two clips, 4A and 4B, are connected by conductor 6. The conductive clips are not limited to the two-piece clips shown. Rather, the conductive clips 4A and 4B can be any types of conductive clips based on any clipping mechanisms as long as they can hold the electrodes of electronic components tightly and release them as needed. The number of clips inside an assembling block is not limited to two.

In one embodiment of the invention, said assembling blocks are temporarily attached to said baseboard by the magnetic interaction between the magnetic or ferromagnetic materials from, respectively, the baseboard and the assembling blocks.

Figure 4A:
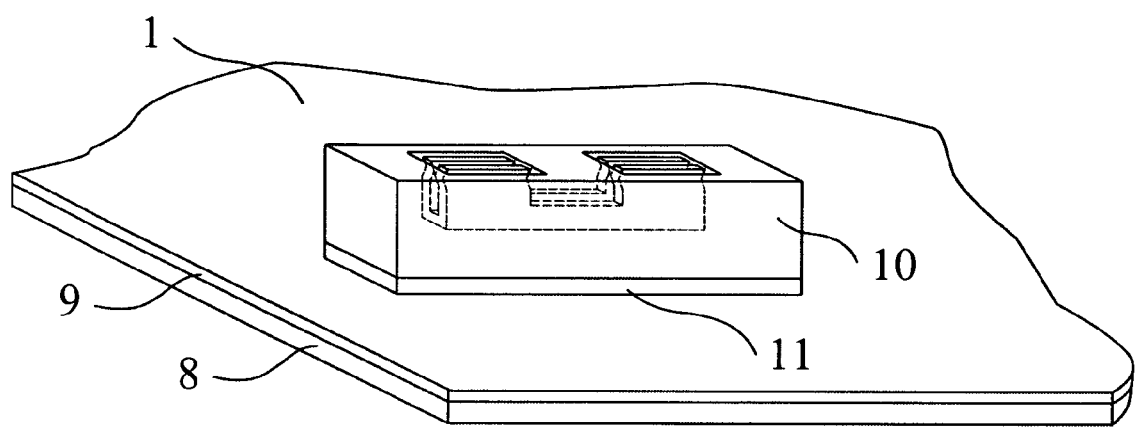
FIGS. 4a and 4b illustrate two examples of attaching an assembling block to a baseboard by magnetic force.

Referring to FIG. 4a, there is shown an example of the embodiment wherein assembling blocks are attached to the baseboard by magnetic interaction. In the embodiment shown, the body 8 of the baseboard 1 is made of ferromagnetic materials such as, but not limited to, steal, iron, cobalt, nickel, or alloys thereof. An electrically insulating sheet 9 is attached onto the surface of the baseboard.

Figure 4B:
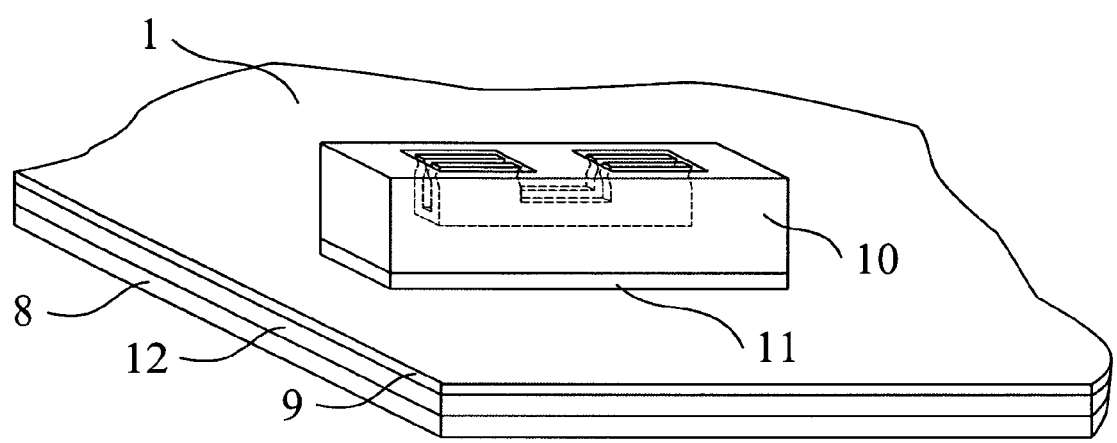

Alternatively, as shown in FIG. 4b, the body 8 of the baseboard is made of non-magnetic, non-ferromagnetic material such as plastic, rubber, porcelain, glass, polymer composite, copper, or aluminum. A ferromagnetic sheet 12 is attached on top of body 8. If the ferromagnetic sheet 12 is conductive, it is covered by an insulating layer 9.

Accordingly, the assembling block 10, made of electrically insulating material such as plastic, rubber, porcelain, or polymer composite, comprises a magnet or magnetic sheet 11 attached to its bottom. As such, the assembling block can be temporarily attached to the baseboard by magnetic force. The materials for the magnet or the magnetic sheet 11 include ceramic or ferrite magnets, alnico magnets, rear-earth magnets, or alloys of these materials.

The magnetic configurations between the baseboard and assembling block are not limited to these described above. For example, body 8 or sheet 12 of the baseboard can be made of magnetic materials. Accordingly, block 10 or sheet 11 of the assembling block can be made of ferromagnetic materials.

In another embodiment of the invention, said assembling blocks are temporarily attached to said baseboard by mechanical mechanisms that result from the interlocking structures respectively on the baseboard and assembling blocks.

Figure 5:
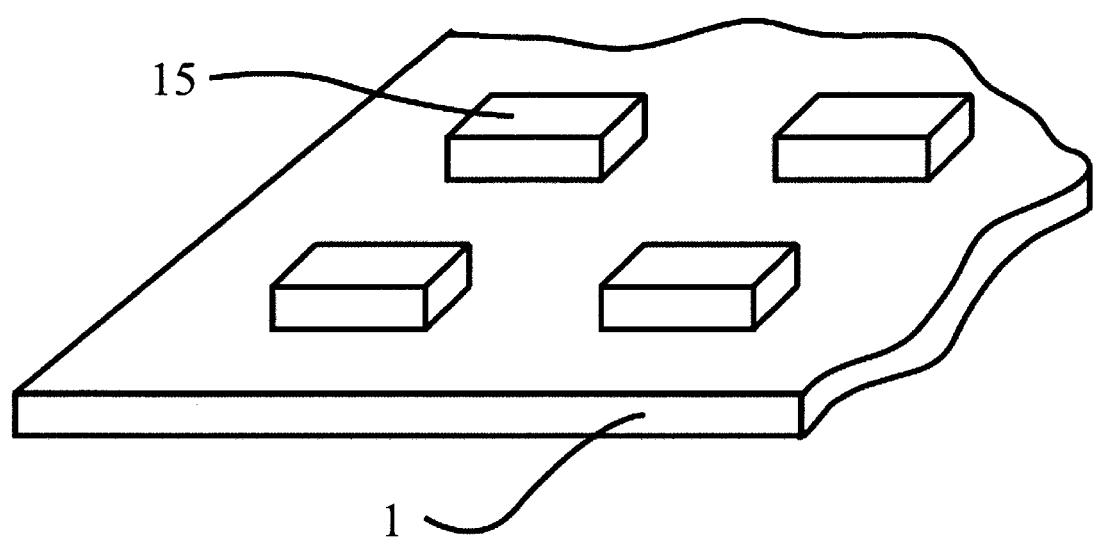

An example of an embodiment wherein the assembling blocks are temporarily attached to the baseboard by mechanical mechanisms is shown in FIG. 1b and FIG. 5. In the embodiment therein shown, baseboard 1 comprises equally distanced, protuberant studs 15 on its surface. The size and distance between the adjacent studs are designed in such a way that an assembling block can be snapped firmly among the studs on the baseboard, therefore interlockingly holding them together. The shape of the studs is not limited to the squares as showing in FIG. 1b and FIG. 5.

Figure 6A:
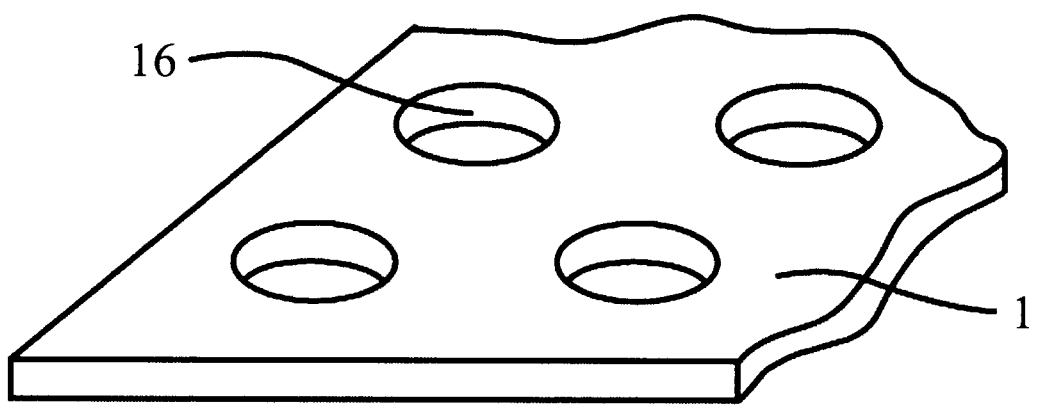
FIGS. 6a and 6b illustrate other examples of mounting an assembling block to a baseboard by a mechanical interlocking mechanism using hollow holes on the baseboard and matching studs on the bottom of the assembling block, or vice versa.
Figure 6B:
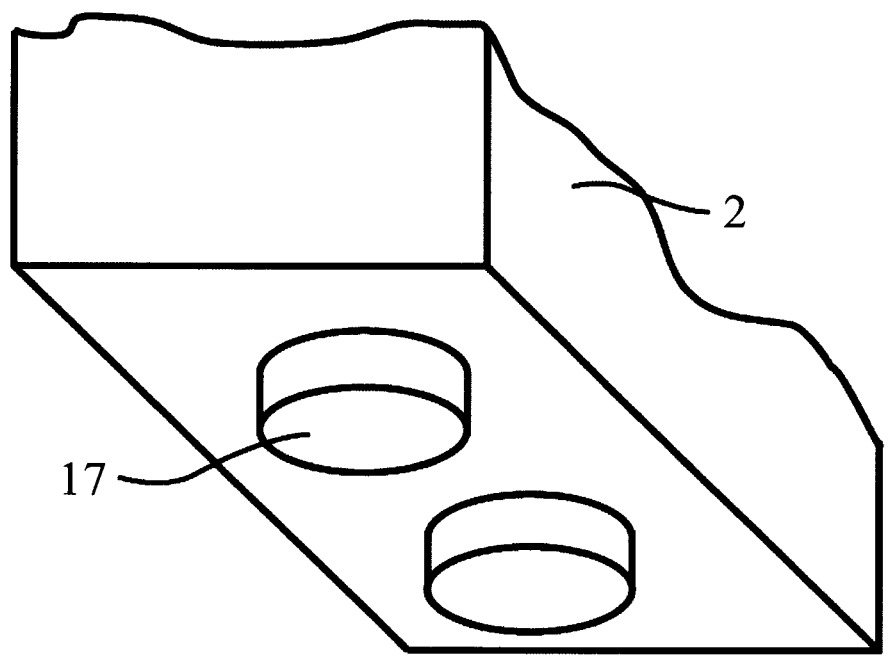

Yet another example of the aforesaid mechanical interlocking embodiment is shown in FIG. 6a and FIG. 6b. As shown in FIG. 6a, baseboard 1 comprises hollow holes 16, and, referring to FIG. 6b, assembling block 2 comprises protuberant studs 17 on its bottom. The shape, size and distance of the holes 16 and studs 17 are designed in such a way that they can be firmly snapped into each other, therefore interlocking the assembling block with the baseboard. The shape of holes 16 and studs 17 is not limited to the circles, as showing in FIG. 6a and FIG. 6b.

Figure 7A:
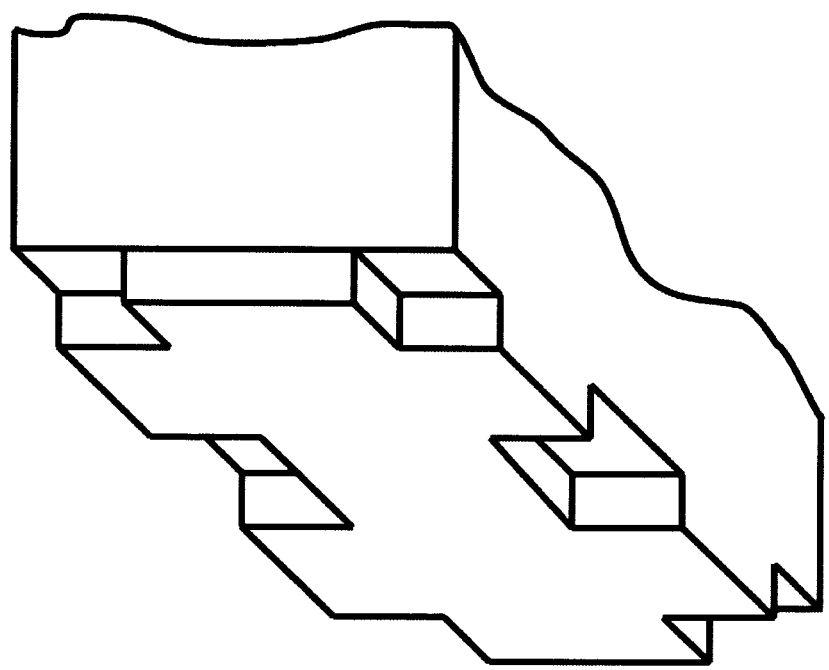
FIGS. 7a, 7b and 7c illustrate examples of the structures on the bottom of a typical or specialty assembling block that can be interlocked with the studs on a baseboard shown in FIG. 5.
Figure 7B:
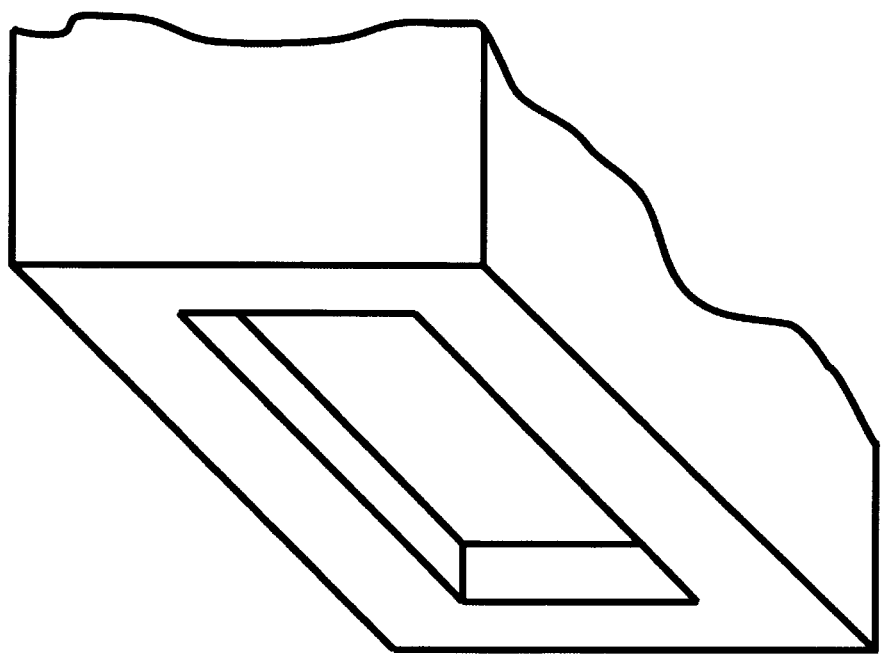
Figure 7C:
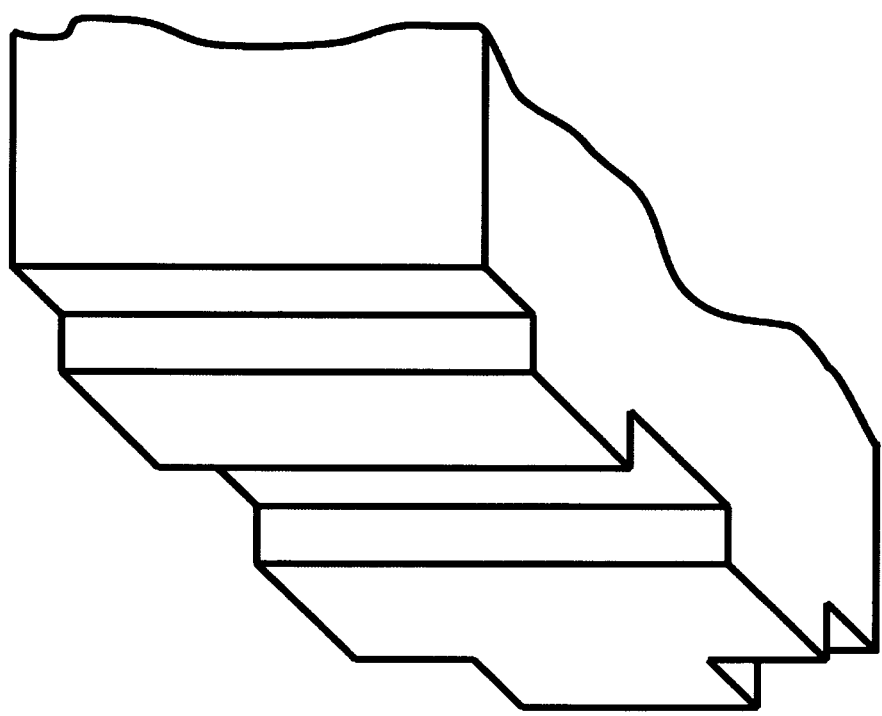

Other types of structures can also be used to attach assembling blocks with a baseboard as long as the shapes and sizes of these structures are designed in such a way that they can be snapped together. For example, the structures shown in FIGS. 7a, 7b and 7c can be used to interlock with the studs shown in FIG. 5.

Figure 8:
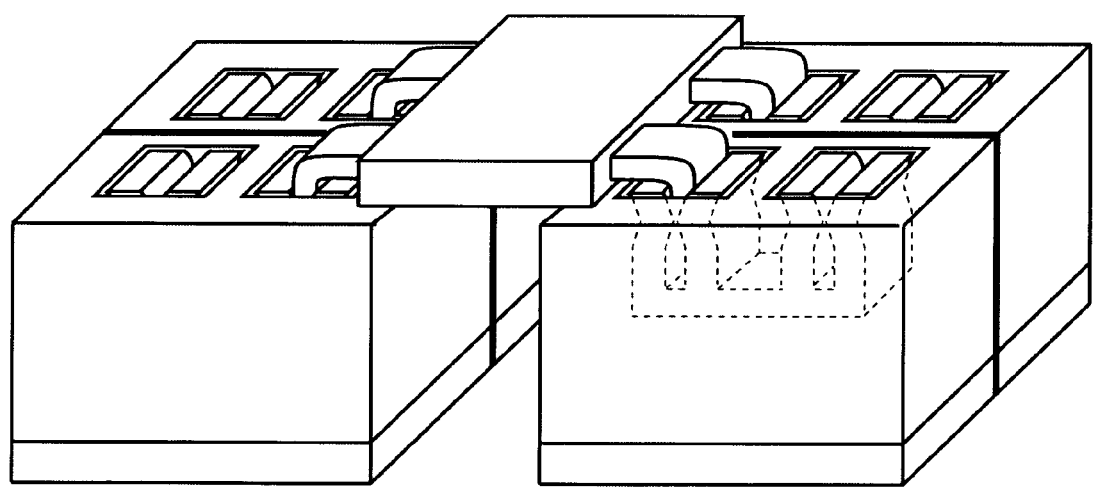
FIG. 8 illustrates an example for assembling an electronic component with multiple (at least 3) electrodes, wherein two-clip assembling blocks are used to connect an IC component with four leads.

In FIG. 8 there is shown an example of still another embodiment of the invention. Specifically, FIG. 8 illustrates a method of connecting electronic components with multiple (at least 3) electrodes or unusual shapes, such as IC chips. In this example of connecting an IC chip with four leads, four two-clip assembling blocks are used. One of the clips from each assembling block is connected with one of the leads of the IC chip. The remaining clips of the assembling blocks are used for connecting the IC chip with other electronic components.

Figure 9:
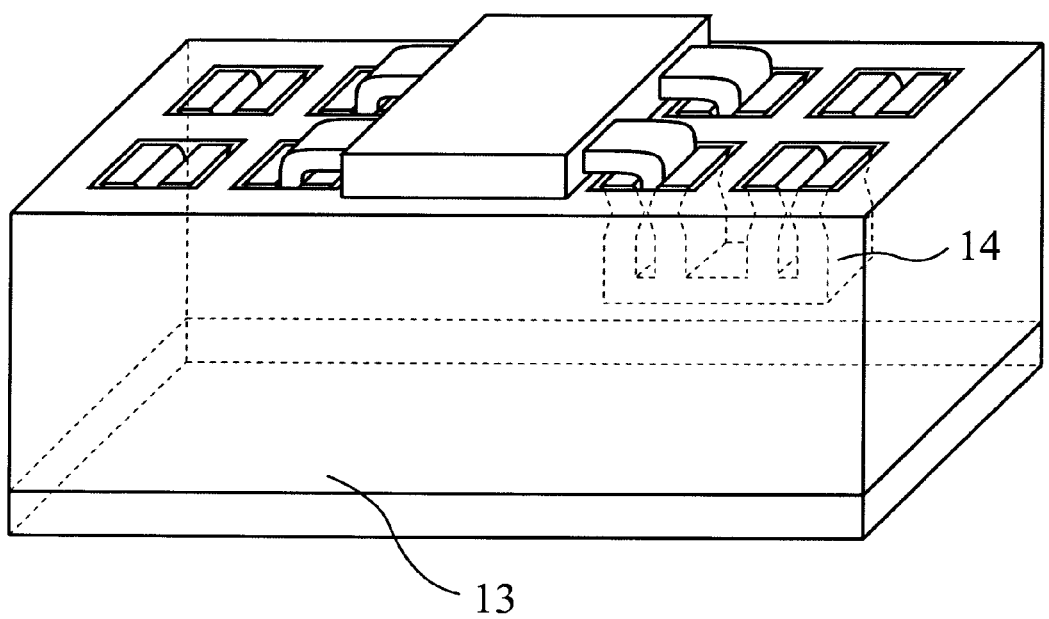
FIG. 9 illustrates an example of assembling electronic components with multiple (at least 3) electrodes or unusual shapes using specialty assembling blocks.

Alternatively, there can be used the specially designed assembling blocks (specialty blocks), shown in FIG. 9. In this example, specialty block 13 comprises a total of four two-clip pairs. One clip from each pair is appointed for connecting the leads of the IC chip; the other four clips are used for connecting the IC chip to other electronic components.

In the embodiments shown, there is no restriction on the shape of the baseboard. It is preferred, however, that the shape of the baseboard be regular. Most preferably, the baseboard has a square, rectangular, or circular shape.

In one way of using said system, there is first drawn or attached a diagram of the desired circuit on the baseboard. Assembling blocks are then attached to the baseboard as connection wires in the diagram. A user can then easily follow the diagram on the baseboard to add the appropriate electronic components into the appropriate assembling blocks.

Having thus described the invention in rather full detail, it will be understood that such detail need not be strictly adhered to, but that additional changes and modifications may suggest themselves to one skilled in the art, all falling within the scope of the invention as defined by the subjoined claims.

What is claimed is:

1. A system for assembling and testing an electronic circuit comprising at least one baseboard having a top surface and a plurality of assembling blocks having different lengths, each assembling block having a bottom surface attached to the top surface of the baseboard and a single linear row of opening holes on the top surface of the assembling block;

each assembling block having a rectangular body composed of electrically insulating material;

each assembling block comprising at least two electrically connected conductive clips; and each of said at least two conductive clips located inside the body of one of said plurality of assembling blocks accessed by one of said opening holes in a top surface of said at least one assembling block, wherein:

(a) the at least two conductive clips and opening holes on each assembling block are arranged lengthwise in a single straight row on the top surface of each assembling block, (b) the at least two electrically conductive clips on each assembling block are formed from the same piece of electrically conductive material, and each conductive clip can receive an electrical component lead between two arms of the clip to provide electrical connection between a first electronic component having a lead inserted into a first of said at least two conductive clips and a second electronic component having a lead inserted into a second of said at least two conductive clips, the plurality of assembling blocks replacing all interconnection wires in the electronic circuit, and and (c) said bottom surface of said at least one assembling block comprising a mechanical interlocking mechanism interlocking the assembling block with the baseboard.

2. The electronic assembling and testing system of claim 1, wherein said mechanical interlocking mechanism comprises structures on a surface of said baseboard and structures on said at least one assembling block, said structures being snapped into each other to temporarily hold or interlock said baseboard and said at least one assembling block together.

3. The electronic assembling and testing system of claim 2, wherein said structures of said mechanical interlocking mechanism are either protuberant or hollow.

4. The electronic assembling and testing system of claim 2, wherein said mechanical interlocking structures comprise studs, holes, trenches, meshes, or crossbars, having a square, circular, rectangular, triangular, or other regular or irregular shape, or a combination of such shapes.

5. The electronic assembling and testing system of claim 2, wherein said mechanical interlocking structures comprise protuberant studs on said baseboard, said protuberant studs having a shape, size and distance therebetween designed so that said at least one assembling block can be firmly snapped among said studs on said baseboard, to temporarily hold said baseboard and said at least one assembling block together.

6. The electronic assembling and testing system of claim 2, wherein said mechanical interlocking structures comprise protuberant studs on said baseboard and protuberant studs on said at least one assembling block, said studs being located on the baseboard and on the at least one assembling block having a shape, size and distance designed respectively in such a way that they can be firmly snapped into each other to temporarily hold the baseboard and the at least one assembling block together.

7. The electronic assembling and testing system of claim 2, wherein said mechanical interlocking structures comprise hollow holes on said baseboard and protuberant studs on said at least one assembling block, and said hollow holes on said baseboard and protuberant studs on said at least one assembling block have a shape, size and distance designed respectively in such way that they can be firmly snapped into each other to temporarily hold said baseboard and said at least one assembling block together.

8. The electronic assembling and testing system of claim 2, wherein said structures comprise protuberant studs on said baseboard and hollow patterns on said at least one assembling block, said protuberant studs on said baseboard and hollow patterns on said at least one assembling block having a shape, size and distance designed respectively in such a way that they can be firmly snapped into each other to temporarily hold said baseboard and at least one assembling block together.

9. The electronic assembly and testing system of claim 1, wherein said baseboard has a square, rectangular, circular, triangular, or other regular or irregular shape, or a combination of such shapes.

10. The electronic assembly and testing system of claim 1, wherein the first electronic component comprises an integrated circuit.

11. A system for assembling and testing an electronic circuit comprising at least one baseboard having a top surface and a plurality of assembling blocks having different lengths, each assembling block having a bottom surface attached to the top surface of the baseboard and a single straight row of opening holes on the top surface of each assembling block;
    each assembling block having a rectangular body composed of electrically insulating material;
    each assembling block comprising at least two electrically connected conductive clips;
    each of said at least two conductive clips located inside the body of one of said plurality of assembling blocks, accessed by one of said opening holes of said assembling block, wherein:
    (a) the at least two conductive clips and opening holes on each assembling block are arranged lengthwise in a single straight row on the top surface of each assembling block,
    (b) said conductive clips on each assembling block are formed from the same piece of electrically conductive material, and each conductive clip can receive an electrical component lead between two arms of the clip to provide electrical connection between a first electronic component having a lead inserted into a first of said at least two conductive clips and a second electronic component having a lead inserted into a second of said at least two conductive clips, the plurality of assembling blocks replacing all interconnection wires in the electronic circuit, and
    said bottom surface of said assembling block attached to the top surface of the baseboard by magnetic-magnetic or a magnetic-ferromagnetic interaction between magnetic or ferromagnetic materials, respectively, from said baseboard and said assembling block.

12. The electronic assembling and testing system of claim 11, wherein said baseboard is composed of either magnetic or ferromagnetic material.

13. The electronic assembling and testing system of claim 11, wherein said baseboard comprises a body composed of non-magnetic or non-ferromagnetic material, and a magnetic or ferromagnetic block or sheet is attached on a surface of said non-magnetic or non-ferromagnetic body.

14. The electronic assembling and testing system of claim 11, wherein said at least one assembling block is composed of either magnetic or ferromagnetic material.

15. The electronic assembling and testing system of claim 11, wherein said at least one assembling block comprises a body composed of non-magnetic or non-ferromagnetic material, and a magnetic or ferromagnetic block or sheet is attached on a surface of said non-magnetic or non-ferromagnetic body.

16. The electronic assembling and testing system of claim 11, wherein at least one of said baseboard and said at least one assembling block is made of magnetic material or has a magnetic block or sheet attached to its surface.

17. The electronic assembling and testing system of claim 11, wherein an electrically insulating layer is attached or coated on a surface of said baseboard.

* * * * *